(12) United States Patent
Yoo

(10) Patent No.: US 10,691,246 B2
(45) Date of Patent: Jun. 23, 2020

(54) DISPLAY DEVICE

(71) Applicant: SAMSUNG DISPLAY CO., LTD., Yongin-si, Gyeonggi-do (KR)

(72) Inventor: Bu Gyoon Yoo, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 131 days.

(21) Appl. No.: 15/894,075

(22) Filed: Feb. 12, 2018

(65) Prior Publication Data
US 2019/0102027 A1    Apr. 4, 2019

(30) Foreign Application Priority Data

Oct. 2, 2017 (KR) .................. 10-2017-0128494

(51) Int. Cl.
| | | |
|---|---|---|
| G06F 3/041 | (2006.01) | |
| H01L 27/32 | (2006.01) | |
| H01L 51/00 | (2006.01) | |
| H01L 51/52 | (2006.01) | |
| G06F 3/044 | (2006.01) | |

(52) U.S. Cl.
CPC .......... *G06F 3/0414* (2013.01); *G06F 3/0445* (2019.05); *H01L 27/323* (2013.01); *H01L 27/3272* (2013.01); *H01L 51/0097* (2013.01); *H01L 51/529* (2013.01); *H01L 51/5237* (2013.01); *G06F 2203/04102* (2013.01); *G06F 2203/04105* (2013.01); *G06F 2203/04107* (2013.01); *H01L 2251/5338* (2013.01)

(58) Field of Classification Search
CPC . G06F 2203/04102; G06F 2203/04105; G06F 3/0414; G06F 3/044; H01L 2251/5338; H01L 27/323; H01L 27/3272; H01L 51/0097; H01L 51/5237; H01L 51/529
See application file for complete search history.

(56) References Cited

U.S. PATENT DOCUMENTS

| | | | | |
|---|---|---|---|---|
| 9,287,329 B1* | 3/2016 | Lee | ............... | H01L 51/0097 |
| 2010/0271329 A1* | 10/2010 | Oohira | ............... | G02F 1/13338 |
| | | | | 345/174 |
| 2011/0001706 A1* | 1/2011 | Sanford | ............... | G06F 3/0412 |
| | | | | 345/173 |
| 2013/0016049 A1* | 1/2013 | Eom | ............... | H01L 27/323 |
| | | | | 345/173 |
| 2015/0036300 A1* | 2/2015 | Park | ............... | H05K 1/147 |
| | | | | 361/749 |
| 2015/0162388 A1* | 6/2015 | Kim | ............... | H01L 27/323 |
| | | | | 257/40 |

(Continued)

FOREIGN PATENT DOCUMENTS

| | | |
|---|---|---|
| KR | 10-1033154 B1 | 5/2011 |
| KR | 10-2017-055252 A | 5/2017 |

*Primary Examiner* — Hong Zhou
(74) *Attorney, Agent, or Firm* — Kile Park Reed & Houtteman PLLC

(57) ABSTRACT

A display device includes a display panel, a first printed circuit board (PCB) on the display panel, and a first touch sensor between the display panel and the first PCB. The PCB includes a first connection portion on a surface of the first PCB facing the first touch sensor. The first touch sensor includes a second connection portion on a surface of the first touch sensor facing the first PCB and electrically connected to the first connection portion.

15 Claims, 12 Drawing Sheets

(56) References Cited

U.S. PATENT DOCUMENTS

| | | | |
|---|---|---|---|
| 2016/0147345 A1* | 5/2016 | Lee | G06F 3/0412 345/173 |
| 2016/0266690 A1* | 9/2016 | Ahn | G06F 3/0412 |
| 2016/0268523 A1* | 9/2016 | Kim | H01L 51/529 |
| 2016/0360622 A1* | 12/2016 | Yach | H05K 3/341 |
| 2017/0003782 A1* | 1/2017 | Heo | G06F 3/044 |
| 2017/0031504 A1* | 2/2017 | Hwang | G06F 3/0488 |
| 2017/0153743 A1* | 6/2017 | Kim | G02B 6/0036 |
| 2017/0179423 A1* | 6/2017 | Kwon | H01L 27/323 |
| 2017/0212616 A1* | 7/2017 | Zou | G06F 3/044 |
| 2017/0242541 A1* | 8/2017 | Iuchi | G06F 3/0412 |

* cited by examiner

DISPLAY DEVICE

CROSS-REFERENCE TO RELATED APPLICATION

Korean Patent Application No. 10-2017-0128494, filed on Oct. 2, 2017, and entitled: "Display Device," is incorporated by reference herein in its entirety.

BACKGROUND

1. Field

One or more embodiments described herein relate to a display device.

2. Description of the Related Art

A variety of displays have been developed. Examples include liquid crystal displays (LCDs) and organic light-emitting diode displays (OLEDs). Many of these displays are equipped to perform a touch sensing function, and thus are suitable for use in smartphones, tablet computers, notebooks, watches, televisions, monitors, digital information displays, and other electronic devices.

In a display which performs a touch sensing function, an image is displayed and a touch input is received in the same space. This allows information to be easily exchanged with a user, and also promotes intuitive manipulation of the display device.

SUMMARY

In accordance with one or more embodiments, a display device includes a display panel, a first printed circuit board (PCB), on the display panel, to provide a signal to drive the display panel, and a first touch sensor between the display panel and the first PCB, wherein the first PCB includes a first connection portion on a surface of the first PCB facing the first touch sensor and wherein the first touch sensor includes a second connection portion on a surface of the first touch sensor facing the first PCB and electrically connected to the first connection portion.

The display panel may have a first surface and a second surface and may display an image on the first surface, and the first PCB may be on the second surface of the display panel. The first touch sensor may sense a magnitude of pressure applied through a touch operation.

The display device may include a front cover on the first surface of the display panel, wherein the front cover has a flat portion and a bent portion and wherein the second connection portion does not overlap the bent portion. The display device may include a second touch sensor on the first surface of the display panel; and a second PCB electrically connected to the second touch sensor and the first PCB, wherein the second PCB and the first touch sensor are spaced apart from each other and wherein the first PCB is between the second PCB and the first touch sensor, the first PCB includes a third connection portion on a surface of the first PCB facing the second PCB, and the second PCB includes a fourth connection portion on a surface of the second PCB facing the first PCB and electrically connected to the third connection portion.

The display device may include a composite sheet between the display panel and the first touch sensor, wherein the composite sheet includes one or more of a buffer sheet, a strength reinforcing sheet, a heat dissipating sheet, an electromagnetic wave shielding sheet, and a light shielding sheet.

The display device may include a front cover on the display panel and having a flat portion and a bent portion at edges of the flat portion in a first direction; and a flexible circuit film electrically connected to the display panel and the first PCB, wherein the bent portion of the front cover includes a surface curved in the first direction and wherein the flexible circuit film is bent in a second direction intersecting the first direction.

The first PCB may have a first surface opposing a second surface, the first PCB may include a third connection portion on the second surface, the first connection portion may be on a first side of the first PCB in the first direction, and the third connection portion may be on a second side of the first PCB in the first direction.

The first PCB may have a first surface opposing a second surface, and the display device may include a first driving chip on the second surface of the first PCB and overlapping the first, touch sensor; and a second driving chip on a concave surface of the bent flexible circuit film and not overlapping the first touch sensor.

The display panel may be connected to the flexible circuit film by the concave surface of the bent flexible circuit film, and the first PCB may be connected to the flexible circuit film by the concave surface of the bent flexible circuit film. The first touch sensor may be longer in the first direction than in the second direction, a length of the front cover in the second direction may be greater than a length of the display panel in the second direction, an end of the display panel in the second direction may protrude more than an end of the first touch sensor in the second direction, and a length of the first PCB in the second direction may be greater than the length of the first touch sensor in the second direction.

The display device may include a second touch sensor between the display panel and the front cover; and a second PCB electrically connected to the second touch sensor and the first PCB, wherein a length of the second PCB in the second direction is greater than the length of the first touch sensor in the second direction. The second PCB and the first touch sensor may partially overlap each other. The first connection portion may contact the second connection portion.

The display device may include conductive balls between the first connection portion and the second connection portion, wherein the first connection portion and the second connection portion are electrically connected by the conductive balls. The first connection portion may be electrically connected to the second connection portion in a plug-socket structure.

In accordance with one or more other embodiments, a display device may include a display panel including a first surface and a second surface, the display panel to display an image on the first surface; a printed circuit board (PCB) electrically connected to the display panel, the PCB to provide a signal to drive the display panel; a flexible circuit film which provides a path through which the signal is transmitted from the PCB to the display panel; and a touch sensor electrically connected to the PCB.

In a state where the flexible circuit film is not bent, the PCB has a first surface facing a same direction as the first surface of the display panel and a second surface opposite to the first surface of the PCB, and the touch sensor has a first surface facing a same direction as the first surface of the display panel and a second surface opposite to the first surface of the touch sensor. The PCB includes a first connection portion on the second surface of the PCB, and the touch sensor includes a second connection portion on the first surface of the touch sensor and electrically connected to the first connection portion. The touch sensor may sense a magnitude of pressure and may be completely covered by the PCB.

In a state where the flexible circuit film is not bent, the circuit film may have a first surface facing a same direction as the first surface of the display panel and a second surface opposite to the first surface of the circuit film, and the display device may include a first driving chip on the first surface of the PCB and a second driving chip on the second surface of the flexible circuit film.

In a state where the flexible circuit film is not bent, the flexible circuit film may have a first surface facing a same direction as the first surface of the display panel and a second surface opposite to the first surface of the circuit film, the display panel may be connected to the flexible circuit film by the second surface of the circuit film, and the PCB may be connected to the flexible circuit film by the second surface of the flexible circuit film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
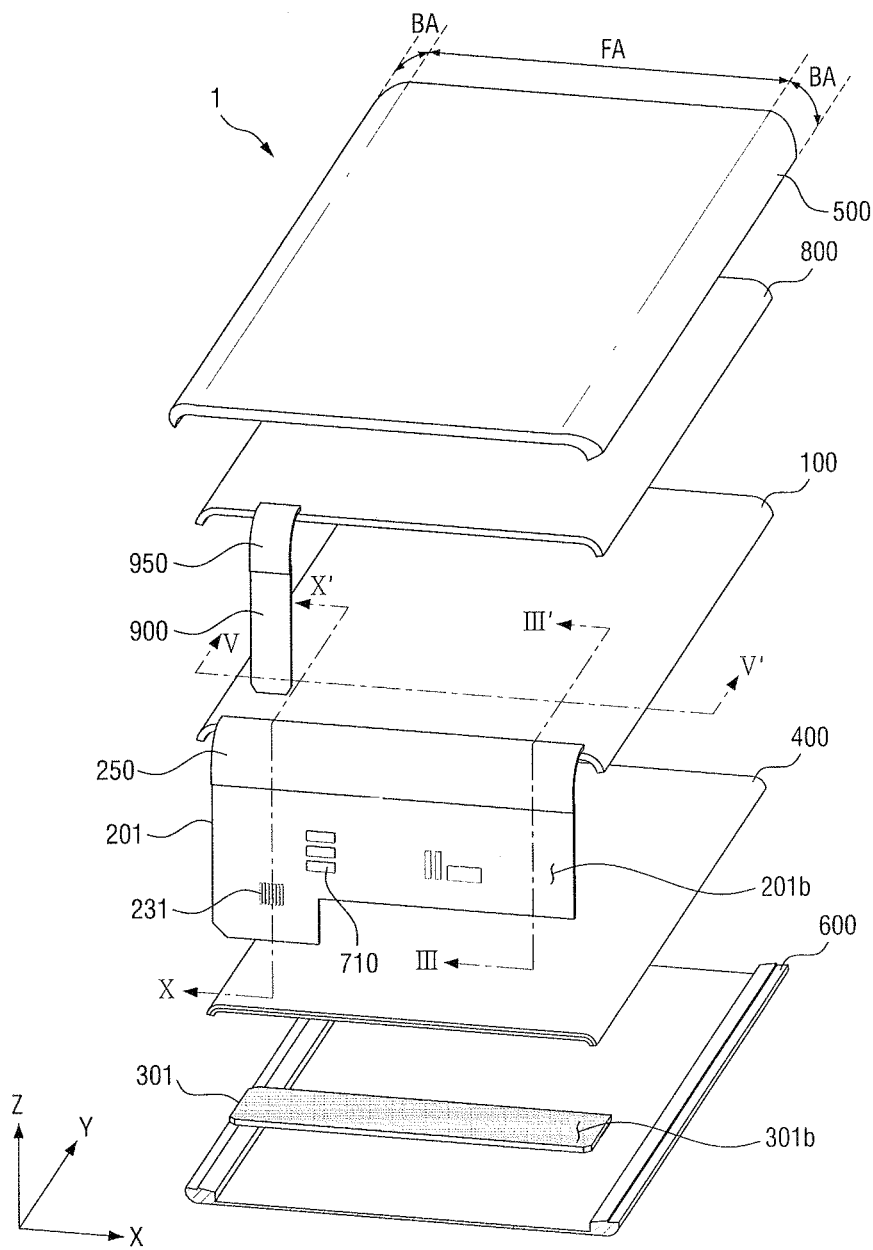
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

In the description that follows, a first direction X refers to an arbitrary direction on a plane, a second direction Y refers to a direction intersecting the first direction X on the plane, and a third direction Z refers to a direction perpendicular to the plane.

Figure 2:
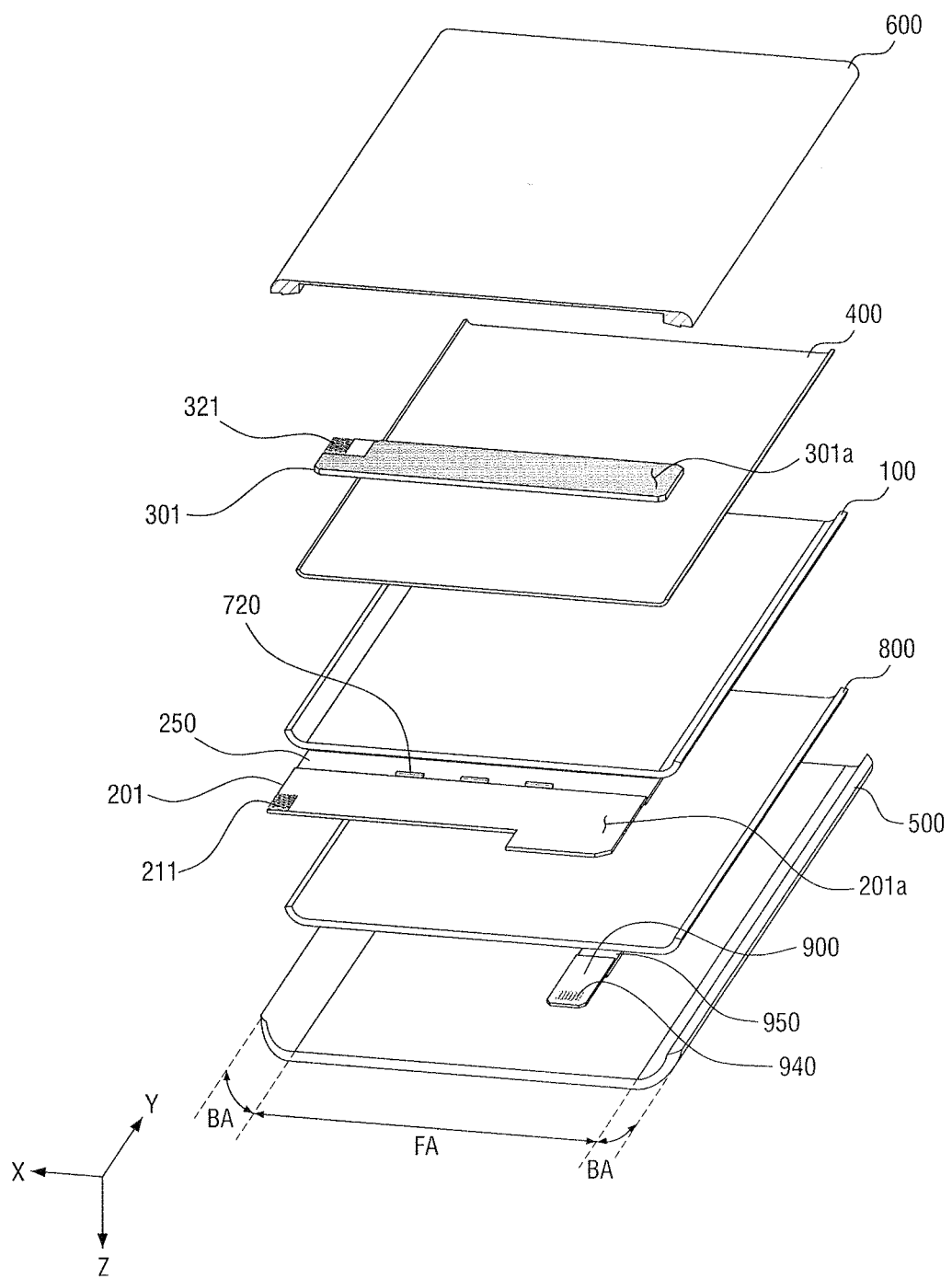
FIG. 2 illustrates a bottom view of the display device.

FIG. 1 illustrates an exploded perspective view of an embodiment of a display device 1. FIG. 2 illustrates a bottom perspective view of the display device 1 of FIG. 1.

Referring to FIGS. 1 and 2, the display device 1 includes a display panel 100, a first printed circuit board (PCB) 201, and a first touch sensing unit 301. The display device 1 may further include a composite sheet member 400, a front cover member 500, and a back cover member 600. The display device 1 may be applied, for example, to various portable electronic devices or large electronic devices.

Figure 3:
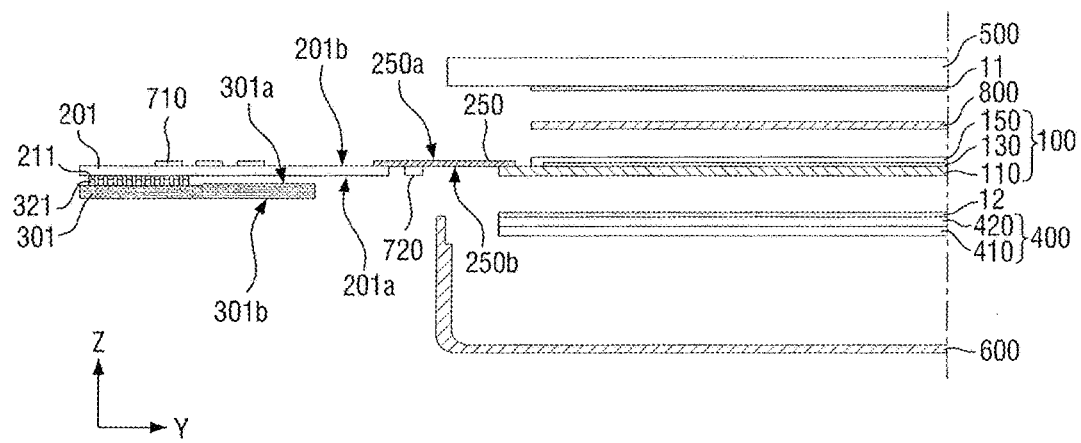
FIG. 3 illustrates a cross-sectional view taken along line III-III' in FIG. 1.
Figure 4:
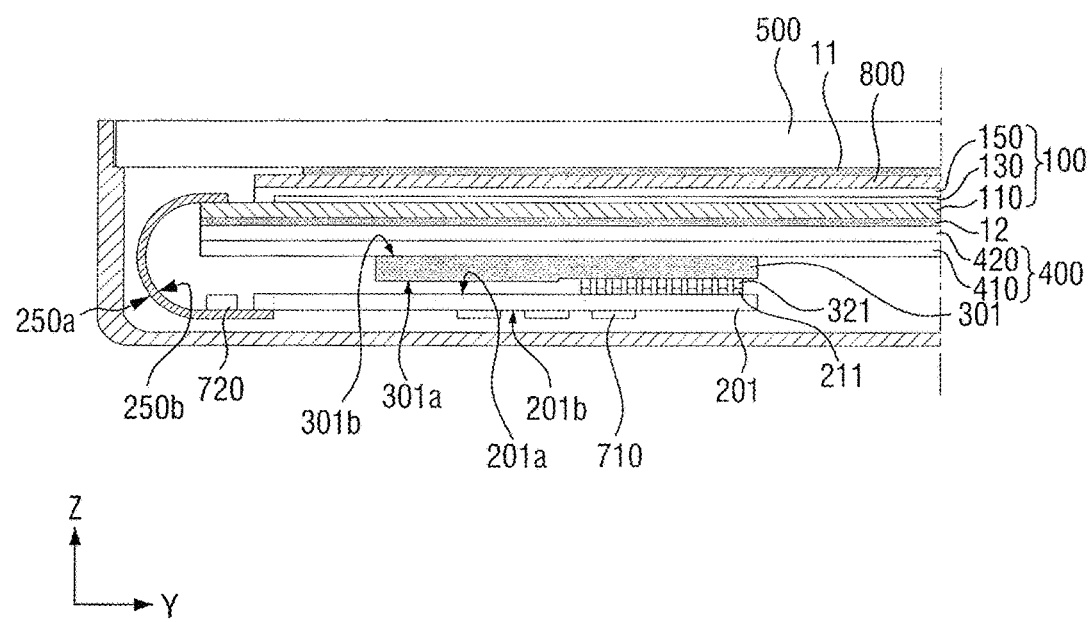
FIG. 4 illustrates an assembled state of the display device.
Figure 5:
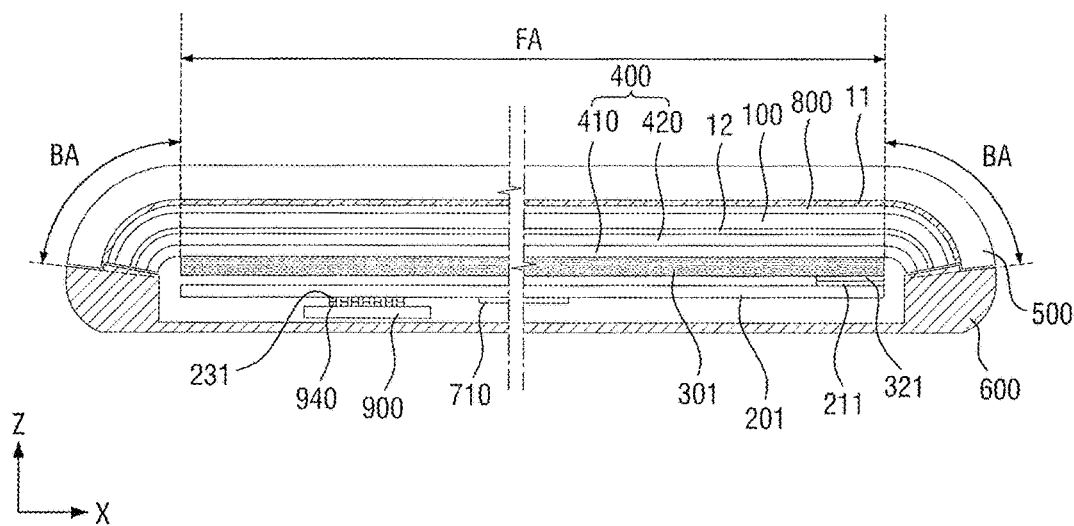
FIG. 5 illustrates a cross-sectional view taken along line V-V' of FIG. 1.

FIG. 3 illustrates a cross-sectional view taken along line III-III' in FIG. 1, and specifically a cross-sectional view illustrating a state in which a first circuit film 250 is not bent. FIG. 4 illustrates a state in which the display device 1 of FIG. 3 is assembled, and specifically a state in which the first circuit film 250 is bent. FIG. 5 illustrates a cross-sectional view taken along line V-V' in FIG. 1.

The display panel 100 may be a panel member that displays an image. In an embodiment, the display panel 100 may be an organic light emitting display panel including an organic light emitting element in each pixel. In one embodiment, the display panel 100 may be a liquid crystal display panel, an electrophoretic display panel, or another type of display. As used herein, a 'pixel' may refer to a single region into which a display area is divided for outputting color light of an image in plan view. Each pixel may output light of one predetermined primary color. For example, one pixel may be a minimum unit for outputting light of a color independently of other pixels.

In an embodiment, the display panel 100 may have a flat portion in a first area FA and a bent portion in a second area BA disposed at edges of the first area FA in a first direction X. The first area FA and the second area BA may be separated by a virtual bending line. In one embodiment, a surface of the flat portion and a surface of the bent portion may not lie in the same plane.

The bent portion of the display panel 100 may slope downward from ends of the flat portion of the display panel 100 in the first direction X and may form a curved surface in the first direction X. A display area for displaying an image may include not only the first area FA of the display device 1, but also at least part of the second area BA of the display device 1. In FIG. 1, the bent portion is at both edges of the flat portion of the display panel 100 in the first direction X. In one embodiment, the bent portion may be at only one side of the flat portion or may be omitted.

The display panel 100 may include a base 110, a light emitting element layer 130 on the base 110, and an encapsulation layer 150 encapsulating the light emitting element layer 130. In an embodiment, the display panel 100 may display an image on its upper surface (e.g., see FIG. 4).

The base 110 may include a driving element layer on a support substrate. The support substrate may be a transparent or opaque insulating plate or film. The support substrate may have flexibility. For example, the support substrate may be a polymer film such as glass or polyimide. The driving element layer may include electrodes, wiring, transistors, etc., for driving the display panel 100.

The light emitting element layer 130 may include one or more light emitting elements in each pixel. In an embodiment, each of the light emitting elements may be an organic light emitting element including an anode and a cathode which face each other. An organic light emitting layer may be between the anode and cathode. Electrons and holes from the anode and the cathode may be recombined in the organic light emitting layer to form excitons. Light is emitted when the excitons change from an excited state to a ground state.

The encapsulation layer 150 may encapsulate the light emitting element layer 130, to thereby prevent the light emitting elements in the light emitting element layer 130 from being damaged by air, moisture, or impurities entering from the outside. In an embodiment, the encapsulation layer 150 may have a structure in which thin films made of an inorganic material and thin films made of an organic material are alternately stacked. In a non-limiting example, the encapsulation layer 150 may include a silicon oxide thin film, a silicon nitride thin film, and a siloxane thin film such as hexamethyldisiloxane. In FIG. 4, the light emitting elements have a top emission structure that emits light toward the upper surface of the display panel 100. The encapsulation layer 150 is on the light emitting layer 150. In an embodiment, the light emitting elements may have a bottom emission structure that emits light toward the upper surface of the display panel 100.

The front cover member 500 may cover the upper surface of the display panel 100. For example, the front cover member 500 may be on the upper surface of the display panel 100. The front cover member 500 may protect the display panel 100, form a display surface on which an image is displayed in the display device 1, and form the exterior of the display device 1. In addition, the front cover member 500 may form a touch surface on which a user touch operation occurs, e.g., a touch surface to be touched by a user.

The front cover member 500 may include a material having high light transmittance and excellent strength. Examples include glass, sapphire, or a polymer substrate. The front cover member 500 may overlap the display panel 100 in a third direction Z to cover the display panel 100. Unless otherwise defined, the term 'overlap' may denote overlapping in the third direction Z.

The front cover member 500 may have a flat portion in the first area FA and a bent portion in the second area BA disposed at the edges of the first area FA in the first direction X. The bent portion of the front cover member 500 may slope downward from the flat portion of the front cover member 500 and form a curved surface in the first direction X. The flat portion and the bent portion of the front cover member 500 may overlap the flat portion and the bent portion of the display panel 100 in the third direction Z, respectively.

In an embodiment, the planar area of the front cover member 500 may be larger than the planar area of the display panel 100. For example, the length of the front cover member 500 in a second direction Y may be greater than the length of the display panel 100 in the second direction Y. Ends of the front cover member 500 in the second direction Y may protrude more than ends of the display panel 100 in the second direction Y, respectively.

The first PCB 201 may partially cover a back surface (e.g., see FIG. 1) of the display panel 100. For example, the first PCB 201 may be on the back surface of the display panel 100.

The first PCB 201 may generate, transmit, or modulate a signal for driving the display panel 100 and provide the signal to the display panel 100. The first PCB 201 may be electrically connected to the display panel 100. The first PCB 201 may include an insulating base and conductive circuit patterns printed on the surface of the insulating base. A plurality of first driving chips 710 or other driving elements mounted on the first PCB 201 may be electrically connected to each other by the conductive circuit patterns, or may be electrically connected to external driving elements by the conductive circuit patterns, to implement a designed circuit. In an embodiment, the first driving chips 710 may be on a back surface 201b (e.g., a lower surface in FIG. 4) of the first PCB 201, e.g., a surface of the first PCB 201 which faces the back cover member 600. At least some of the first driving chips 710 may overlap the first touch sensing unit 301 in the third direction Z.

The first PCB 201 may include first connection portions 211 on its front surface 201a (e.g., an upper surface in FIG. 4), that is, a surface of the first PCB 201 which faces the display panel 100. The first connection portions 211 may be electrically connected to second connection portions 321 of the first touch sensing unit 301. For example, the first PCB 201 and the first touch sensing unit 301 may be connected to each other by the first connection portions 211 and the second connection portions 321, and may exchange signals with each other through the first connection portions 211 and the second connection portions 321. Therefore, an image may be displayed on the display panel 100 based on touch information input by a user through a touch operation. The first connection portions 211 and the second connection portions 321 may be connected to each other within the first area FA.

The first connection portions 211 may be conductive pads having a larger area than the conductive circuit patterns on a surface (e.g., the front surface 201a) of the first PCB 201. The first connection portions 211 may be a plurality of rod-shaped pads extending in the first direction X. The first connection portions 211 may protrude from the front surface 201a of the first PCB 201. In an embodiment, the first connection portions 211 may be formed as extensions to the conductive circuit patterns on the surface of the first PCB 201, instead of protruding from the front surface 201a of the first PCB 201.

In a non-limiting example, sides of the first PCB 201 in the first direction X may be asymmetrical with respect to a virtual reference line extending in the second direction Y. In this case, the first connection portions 211 of the first PCB 201 may be on only one side (e.g., a left side in FIG. 2) of the first PCB 201 in the first direction X.

The display panel 100 and the first PCB 201 may be electrically connected to each other by the first circuit film 250. For example, the first circuit film 250 may provide a path through which a signal is provided from the first PCB 201 to the display panel 100. The first circuit film 250 may be bent in the second direction Y. The bent first circuit film 250 may have a concave surface 250b and a convex surface 250a. The bent first circuit film 250 may partially overlap the display panel 100 in the third direction Z.

The first circuit film 250 may include conductive circuit patterns printed on a surface of an insulating base. The insulating base of the first circuit film 250 may include a material having greater flexibility than the insulating base of the first PCB 201. For example, the insulating base of the first circuit film 250 may include a polymer film such as polyimide, polyester, or polyepoxy.

One or more second driving chips 720 may be mounted on the first circuit film 250. For example, the second driving chips 720 may be mounted on the concave surface 250b of the first circuit film 250 in a state where the first circuit film 250 is bent. The second driving chips 720 may be, for example, driver integrated circuits. The first circuit film 250 and the second driving chips 720 may form a chip-on-film package. The first PCB 201, the display panel 100, and the second driving chips 720 may be electrically connected to each other by the conductive circuit patterns of the first circuit film 250 to implement a designed circuit.

Since the second driving chips 720 are on the concave surface 250b of the first circuit film 250, the space occupied by the second driving chips 720 can be reduced or minimized, and thus the thickness of the display device 1 may be reduced. In addition, the second driving chips 720 may be protected from external force. In some embodiments, the second driving chips 720 may be spaced apart from each other along the first direction X. In addition, the second driving chips 720 may not overlap the first touch sensing unit 301 in the third direction Z.

In an embodiment, the display panel 100 may be connected to the first circuit film 250 by the concave surface 250b of the first circuit film 250. For example, the display panel 100 may be connected to the first circuit film 250 by the conductive circuit patterns on the concave surface 250b of the first circuit film 250. In one embodiment, the display panel 100 and the first circuit film 250 may be indirectly electrically connected to each other, for example, by an anisotropic conductive film, an anisotropic conductive adhesive, or an anisotropic conductive paste, or may be directly electrically connected, for example, by a thermocompression bonding method.

In one embodiment, the first PCB 201 may be connected to the first circuit film 250 by the concave surface 250b of the first circuit film 250. For example, the first PCB 201 may be connected to the first circuit film 250 by the conductive circuit patterns on the concave surface 250b of the first circuit film 250. The first PCB 201 and the first circuit film 250 may be electrically connected to each other indirectly or directly.

In FIG. 1, etc., the display panel 100 and the driving elements are connected by a relatively rigid PCB (e.g., the first PCB 201) and a relatively flexible circuit film (e.g., the first circuit film 250). In one embodiment, the first circuit film 250 may be omitted and the first PCB 201 may have flexibility. The first PCB 201 may have flexibility and may be bent, for example, in the second direction Y. Therefore, the first PCB 201 and the display panel 100 may be electrically connected by the conductive circuit patterns on the surface of the first PCB 201, and the first driving chips 710 and the second driving chips 720 may be electrically connected by the conductive circuit patterns on the surface of the first PCB 201.

The first touch sensing unit 301 may be between the display panel 100 and the first PCB 201. For example, the first touch sensing unit 301 may be on the back surface of the display panel 100. The first touch sensing unit 301 may at least partially overlap the display panel 100 and the first PCB 201 in the third direction Z. In addition, the first touch sensing unit 301 may be completely covered by the display panel 100. For example, ends of the display panel 100 in the second direction Y may protrude more than ends of the first touch sensing unit 301 in the second direction Y, respectively. In addition, the first touch sensing unit 301 may be completely covered by the first PCB 201. For example, the length of the first PCB 201 in the second direction Y may be greater than the length of the first touch sensing unit 301 in the second direction Y.

In some embodiments, the first touch sensing unit 301 may be longer in the first direction X than in the second direction Y. The first touch sensing unit 301 may sense information input to the display device 1 by a user through a touch operation. The touch operation may be performed, for example, using a part of the user's body or a stylus pen.

For example, the first touch sensing unit 301 may sense one or more of information about the magnitude of touch pressure, information about whether a touch has been made, touch position information, and information about the shape of an object performing a touch function. A case where the first touch sensing unit 301 is a module for sensing information about the magnitude of touch pressure will hereinafter be described as an example.

Figure 6:
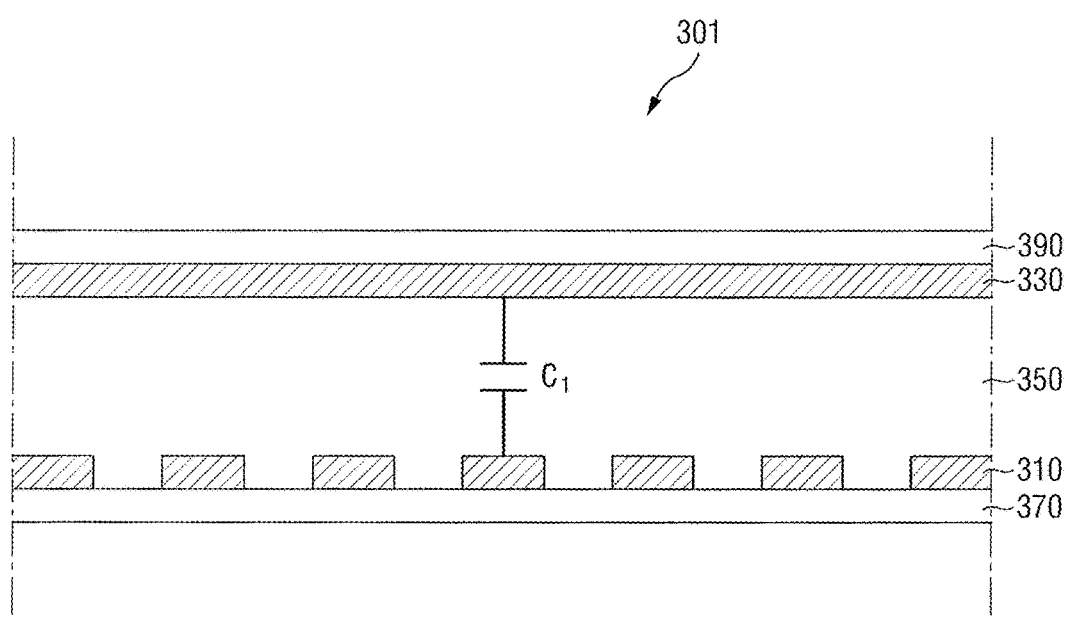
FIG. 6 illustrates an embodiment of a touch sensing unit.
Figure 7:
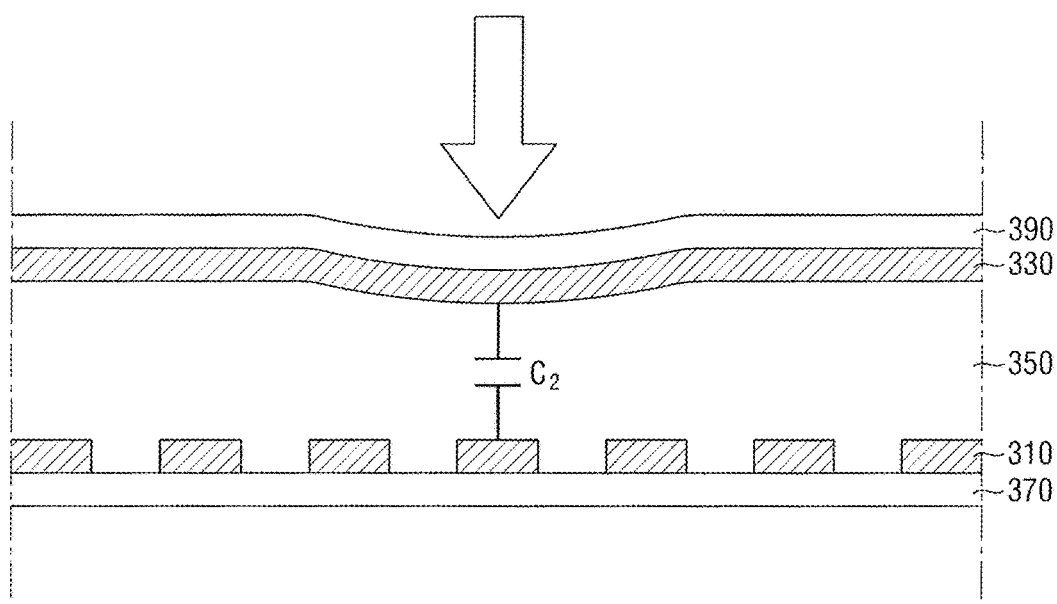
FIG. 7 illustrates an example of the operation of the touch sensing unit.

FIG. 6 illustrates a cross-sectional view of an embodiment of the first touch sensing unit 301 of FIG. 1 when no pressure has been applied. FIG. 7 illustrates an example of the operation of the first touch sensing unit 301 of FIG. 6 when pressure is applied to the first touch sensing unit 301.

Referring to FIGS. 1 to 7, the first touch sensing unit 301 may include first sensing electrodes 310 and a second sensing electrode 330 which face each other. An elastic layer 350 may be between the first sensing electrodes 310 and the second sensing electrode 330.

The first sensing electrodes 310 and the second sensing electrode 330 may face each other and may be spaced apart from each other. The first sensing electrodes 310 and the second sensing electrode 330 may extend in directions intersecting each other. In an embodiment, the first sensing electrodes 310 and the second sensing electrode 330 may overlap each other to extend in the same direction or may not overlap each other to extend in the same direction. The same or different voltages may be applied to the first sensing electrodes 310 and the second sensing electrode 330, or at least one of the first sensing electrodes 310 and the second sensing electrode 330 may be grounded.

The elastic layer 350 between the first sensing electrodes 310 and the second sensing electrode 330 may be compressed when pressure is applied and may return to its original shape when the pressure is removed. For example, the first sensing electrodes 310, the second sensing electrode 330, and the elastic layer 350 may be structured such that the distance between the first sensing electrodes 310 and the second sensing electrode 330 is partially changed according to the position of pressure applied, the presence or absence of the pressure, and/or the intensity of the pressure.

The first sensing electrodes 310, the second sensing electrode 330, and the elastic layer 350 may form a capacitor. For example, when no pressure is applied to the first touch sensing unit 301, a first capacitance $C_1$ may be formed between the first sensing electrodes 310 and the second sensing electrode 330. When pressure is applied to the first touch sensing unit 301 in a vertical direction, a second capacitance $C_2$ having a magnitude different from that of the first capacitance $C_1$ may be formed between the first sensing electrodes 310 and the second sensing electrode 330. The magnitude of the capacitance between the first sensing electrodes 310 and the second sensing electrode 330 may be determined based on the distance between the first sensing electrodes 310 and the second sensing electrode 330 and the dielectric constant of the elastic layer between the first sensing electrodes 310 and the second sensing electrode 330.

In an embodiment, the first touch sensing unit 301 may measure the magnitude of the second capacitance $C_2$, and the display device 1 may obtain information about one or more of the position of pressure applied, the presence or absence of the pressure, and the intensity of the pressure based on the difference ($C_1$–$C_2$) of the magnitude of the second capacitance $C_2$ from the predetermined magnitude of the first capacitance $C_1$.

Information about the magnitude of the second capacitance $C_2$ measured by the first touch sensing unit 301 may be sent to the second connection portions 321 of the first touch sensing unit 301. The second connection portions 321 may be on a back surface 301a (e.g., a lower surface in FIG. 4) of the first touch sensing unit 301, e.g., a surface of the first touch sensing unit 301 which faces the first PCB 201. The second connection portions 321 of the first touch sensing unit 301 and the first connection portions 211 of the first PCB 201 may be electrically connected to each other as described above.

In some embodiments, the first touch sensing unit 301 may further include a first support member 370 and a second support member 390 which fix the first sensing electrodes 310, a second sensing electrode 330, and the elastic layer 350.

Figure 8:
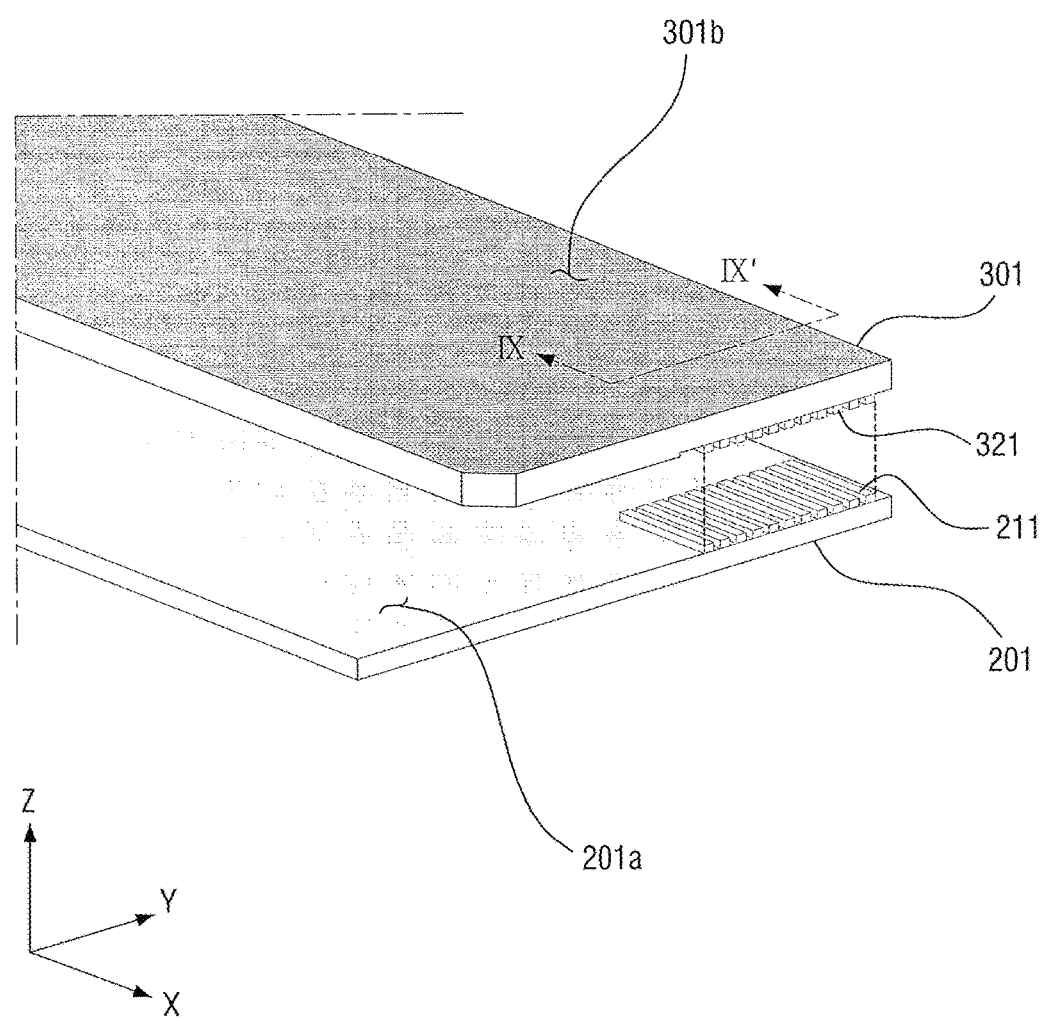
FIG. 8 illustrates an embodiment of a connection between a printed circuit board (PCB) and the touch sensing unit.
Figure 9:
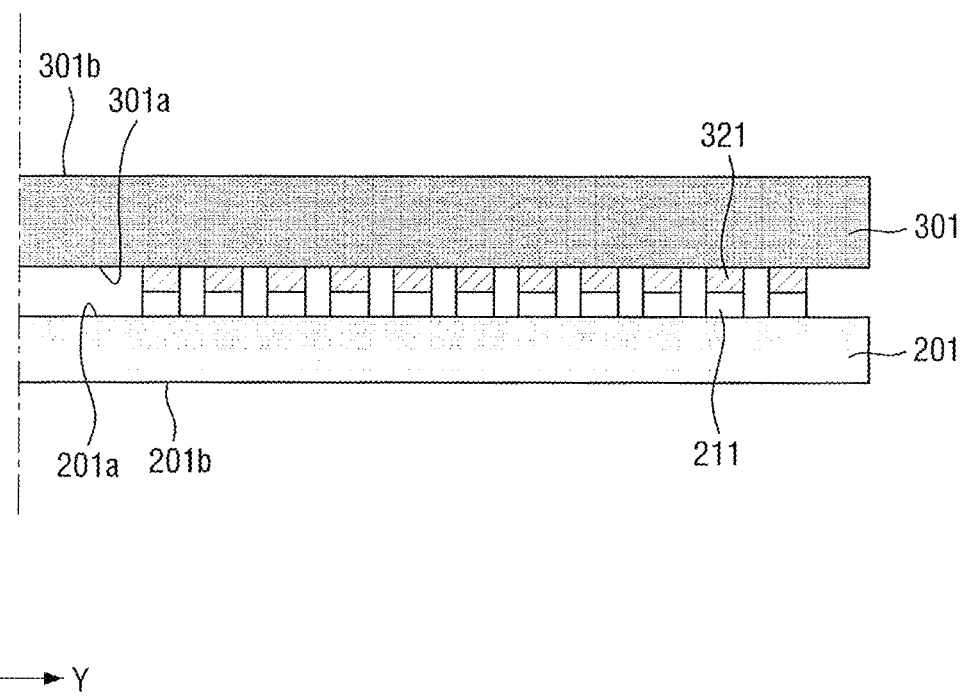
FIG. 9 illustrates a cross-sectional view taken along line IX-IX' in FIG. 8.

FIG. 8 illustrates an embodiment of a connection between the first PCB 201 and the first touch sensing unit 301 of FIG. 1. FIG. 9 illustrates a cross-sectional view taken along line IX-IX' in FIG. 8.

The second connection portions 321 may be a plurality of rod-shaped pads extending in the first direction X. As a non-limiting example, the second connection portions 321 may protrude from the back surface 301a of first touch sensing unit 301.

In an embodiment, the first connection portions 211 may overlap the second connection portions 321 in the third direction Z and may directly contact the second connection portions 321. For example, upper surfaces (e.g., in FIG. 9) of the first connection portions 211 and lower surfaces (e.g., in FIG. 9) of the second connection portions 321 may contact each other and may be directly electrically connected to each other. The first connection portions 211 and the second connection portions 321 may be connected, for example, by a thermocompression bonding method.

In addition, the first connection portions 211 and the second connection portions 321 may be in the first area FA. The first connection portions 211 and the second connection portions 321 may overlap the respective flat portions of the display panel 100, the front cover member 500, and the composite sheet member 400, and may not overlap the respective bent portions of the display panel 100, the front cover member 500, and the composite sheet member 400. When pressure is applied to the bent portion of the front cover member 500 that forms the exterior of the display device 1, it may have components in the vertical direction (e.g., the third direction Z) and a horizontal direction (e.g., in the first direction X and the second direction Y).

If the horizontal pressure component is applied to a position where the first connection portions 211 and the second connection portions 321 are connected to each other, the first connection portions 211 and the second connection portions 321 may be displaced. For example, the first connection portions 211 and the second connection portions 321 may be placed to overlap the flat portion of the front cover member 500 to improve the connection stability between the first PCB 201 and the first touch sensing unit 301.

The first PCB 201 of the display device 1 may directly face the first touch sensing unit 301. In addition, the first PCB 201 may include the first connection portions 211 on its upper surface (e.g., in FIG. 9) facing the first touch sensing unit 301. The first touch sensing unit 301 may include the second connection portions 321 on its lower surface (e.g., in FIG. 9) facing the first PCB 201. The first connection portions 211 and the second connection portions 321 may be directly connected to each other.

In accordance with one or more embodiments, the first PCB 201 and the first touch sensing unit 301 may be stably connected to each other without a member for electrically connecting the first PCB 201 and the first touch sensing unit 301, such as a circuit film or a connector film having conductive patterns. Therefore, the first touch sensing unit 301 may perform a precise touch sensing function, and an image can be displayed based on touch information obtained by the first touch sensing unit 301 without a defect such as a time delay. In addition, since the structure of the display device 1 is simplified, an increase in the durability and life of the display device 1 can be expected, and the thickness of the display device 1 can be reduced or minimized.

Moreover, since the first PCB 201 and the first touch sensing unit 301 are connected using the upper surface 201a (e.g., in FIG. 9) of the first PCB 201 and the lower surface 301a (e.g., in FIG. 9) of the first touch sensing unit 301, where it may be difficult to place driving elements in view of the thinning of the display device 1 and the touch sensing accuracy of the touch sensing unit, elements may be additionally placed on the lower surface 201b of the first PCB 301 and/or an upper surface 301b of the first touch sensing unit 301. Therefore, space may be used more efficiently.

Further, the first PCB 201 and the first touch sensing unit 301 are not only electrically connected to each other by the first connection portions 211 and the second connection portions 321, but also physically coupled and integrated with each other by the first connection portions 211 and the second connection portions 321. For example, the relative positions of the first PCB 201 and the first touch sensing unit 301, by extension, the relative positions of the display panel 100 and the first touch sensing unit 301, may be fixed without any change. This may improve the reliability of the touch sensing function of the display device 1.

The composite sheet member 400 may be between the display panel 100 and the first touch sensing unit 301. For example, the composite sheet member 400 may be on the back surface of the display panel 100. At least part of the composite sheet member 400 may overlap the display panel 100 in the third direction Z. The composite sheet member 400 may have a flat portion in the first area FA and a bent portion in the second area BA disposed at the edges of the first area FA in the first direction X. The flat portion and the bent portion of the composite sheet member 400 may overlap the flat portion and the bent portion of the display panel 100 in the third direction Z, respectively. Therefore, the composite sheet member 400 may substantially cover the entire back surface of the display panel 100.

In an embodiment, the composite sheet member 400 may include one or more of a buffer sheet, a strength reinforcing sheet, a heat dissipating sheet, an electromagnetic wave shielding sheet, and a light shielding sheet. In FIG. 4, the composite sheet member 400 includes two sheets, e.g., a lower sheet 410 and an upper sheet 420. In one embodiment, the composite sheet member 400 may include one sheet having a complex function or three or more sheets. The lower sheet 410 and the upper sheet 420 may be in direct contact with each other or may be bonded together by a bonding layer between them.

The buffer sheet may be disposed, for example, on the back surface of the display panel 100 to prevent the display device 1 from being damaged by an external force. For example, the buffer sheet may protect the display device 1 by absorbing at least some of external shock or dispersing the external shock. The buffer sheet is not particularly limited as long as it is a material favorable for shock absorption and/or dispersion. However, the buffer sheet may be include, for example, a polymer material such as urethane resin, carbonate resin, propylene resin or ethylene resin, a rubber material, or a foam mold of any of these materials.

The strength reinforcing sheet may be on the back surface of the display panel 100 to improve the overall strength of the display device 1. In an embodiment in which the display panel 100 is flexible, the strength reinforcing sheet may maintain the overall shape of the display device 1, together with the front cover member 500 and the back cover member 600. For example, when a strong external force is applied to the display device 1 or when the display device 1 is exposed to high temperature for a long time, the internal elements of the display device 1 may warp. In this case, the strength reinforcing sheet may maintain its shape to fix the position of the display panel 100 and prevent deterioration in display quality of the display device 1. The strength reinforcing sheet may be made, for example, from various materials having rigidity and/or strength. In one embodiment, the strength reinforcing sheet may include a rigid polymer material or a metal material.

The heat dissipating sheet may be on the back surface of the display panel 100 and on the front surface 201a of the first PCB 201, in order to absorb and disperse at least some of the heat generated from the display panel 100, the first PCB 201, the first driving chips 710, and the second driving chips 720. The heat dissipating sheet may be made of various materials having, for example, heat absorption and/or transmission qualities. In some embodiments, the heat dissipating sheet may include a graphite film obtained by carbonizing and/or graphitizing a polymer film such as polyimide, a carbon-based material such as carbon nanotubes or graphene, a polymer material such as imide resin or ethylene resin, a metal material such as aluminum or copper, or a metal alloy material.

The electromagnetic wave shielding sheet may be on the back surface of the display panel 100 to shield electromagnetic waves generated from the first PCB 201, the first driving chips 710, and the second driving chips 720. The electromagnetic wave shielding sheet may be made from various materials having capable of blocking the transmission of electromagnetic waves. In one embodiment, the electromagnetic wave shielding sheet may include a conductive material such as a metal or a metal alloy.

In some embodiments, the display panel 100 and the composite sheet member 400 may be bonded together by a first bonding layer 12 between them. The first bonding layer 12 may include, for example, an optical clear adhesive such as a double-sided tape, an optical clear resin such as a photocurable resin or a thermosetting resin, or a pressure sensitive adhesive.

The back cover member 600 may be on the back surface of the display panel 100, e.g., on the back surface 201b of the first PCB 201. The back cover member 600 may cover and accommodate the display panel 100, the first touch sensing unit 301, and the first PCB 201. The back cover member 600 may be made of a material having strength and rigidity, e.g., a polymer material or a metal material. For example, the back cover member 600 may include a metal material such as aluminum, nickel, or an alloy of these materials. The back cover member 600 may protect and fix the display panel 100 as well as the first touch sensing unit 301 and the first PCB 201 on the back side of the display panel 100. In some embodiments, the back cover member 600 may be omitted.

Edges of the back cover member 600 in the first direction X may have a mount portion on which the front cover member 500, the display panel 100 and the composite sheet member 400 (each having the flat portion and the bent portion) are mounted. For example, the back cover member 600 may have a shape or step corresponding to that of the front cover member 500, the display panel 100, and the composite sheet member 400 (each having a curved surface in the first direction X) in order to fix the front cover member 500, the display panel 100, and the composite sheet member 400.

Figure 10:
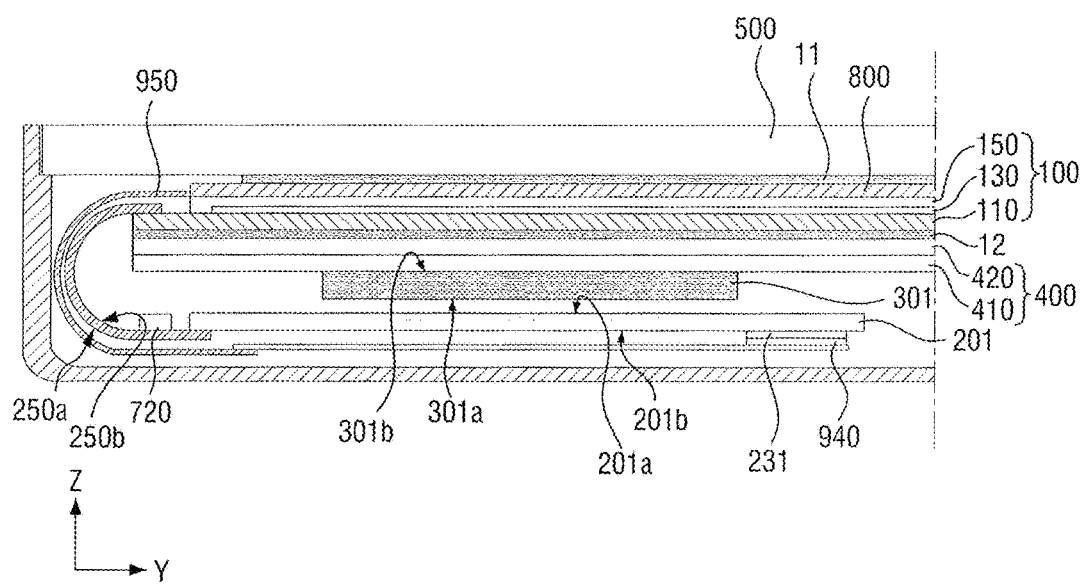
FIG. 10 illustrates a cross-sectional view taken along line X-X' in FIG. 1.

FIG. 10 illustrates a cross-sectional view taken along line X-X' of FIG. 1.

Referring to FIG. 10, in some embodiments, the display device 1 may further include a second touch sensing unit 800, a second PCB 900, and/or a second circuit film 950.

The second touch sensing unit 800 may be between the display panel 100 and the front cover member 500. For example, the second touch sensing unit 800 may be on a front surface of the display panel 100. In one embodiment, the second touch sensing unit 800 may be on a light path extending from the display panel 100 to a viewer (or viewing location). The first touch sensing unit 301 and the second touch sensing unit 800 may be spaced apart from each other by the display panel 100 between them.

The second touch sensing unit 800 may at least partially overlap the display panel 100 and may overlap the display panel 100 and the first touch sensing unit 301 in the third direction Z. In some embodiments, the second touch sensing unit 800 may have a flat portion in the first area FA and a bent portion in the second area BA which is disposed at edges of the first area FA in the first direction X. The flat portion and the bent portion of the second touch sensing unit 800 may overlap the flat portion and the bent portion of the display panel 100 in the third direction Z, respectively. In this case, the first area FA of the display device 1 and also at least part of the second area BA of the display device 1 may sense touch information.

The second touch sensing unit 800 may sense information input to the display device 1 by a user through a touch operation. For example, the second touch sensing unit 800 may sense one or more of information about the magnitude of touch pressure, information about whether a touch has been made, touch position information, and information about the shape of an object performing a touch function. The second touch sensing unit 800 and the first touch sensing unit 301 may sense different types of touch information.

In an embodiment, the second touch sensing unit 800 may sense the touch position information (e.g., coordinates) at which a user performed a touch operation based on the first direction X and the second direction Y in plan view. Various methods may be used to implement the second touch sensing unit 800 for sensing a touch position. For example, the second touch sensing unit 800 may be implemented using a capacitive method, a resistive method, an elastic wave method, an infrared method, an optical imaging method, a dispersive signal method, or an acoustic pulse recognition method.

In some embodiments, the second touch sensing unit 800 may be directly on the display panel 100. For example, the second touch sensing unit 800 may be directly on the encapsulation layer 150 of the display panel 100. When the second touch sensing unit 800 includes sensing electrodes made of a conductive material, at least some of the sensing electrodes may be deposited directly on the encapsulation layer 150. In one embodiment, the second touch sensing unit 800 may also be bonded to the display panel 100 by a bonding layer between them.

In addition, the second touch sensing unit 800 and the front cover member 500 may be bonded to each other by a second bonding layer 11 between them. The second bonding layer 11 may include, for example, an optical clear adhesive such as a double-sided tape, an optical clear resin such as a photocurable resin or a thermosetting resin, or a pressure sensitive adhesive.

The second PCB 900 may partially cover the back surface 201b (e.g., in FIG. 1) of the first PCB 201. For example, the second PCB 900 may be on the back surface 201b of the first PCB 201, and the second PCB 900 and the first touch sensing unit 301 may be spaced apart from each other by the first PCB 201 between them. The second PCB 900 and the first touch sensing unit 301 may partially overlap each other in the third direction Z. The length of the second PCB 900 in the second direction Y may be greater than the length of the first touch sensing unit 301 in the second direction Y.

The second PCB 900 may generate, transmit, or modulate a signal for driving the second touch sensing unit 800 and provide the signal to the second touch sensing unit 800. The second PCB 900 may provide information obtained from the second touch sensing unit 800 to the first PCB 201. The second PCB 900 may be electrically connected to the second touch sensing unit 800 and the first PCB 201. The second PCB 900 may include an insulating base and conductive circuit patterns printed on the surface of the insulating base.

In an embodiment, the first PCB 201 may include third connection portions 231 on its back surface 201b (e.g., the lower surface in FIG. 4), e.g., a surface of the first PCB 201 facing the second PCB 900. The first connection portions 211 and the third connection portion 231 of the first PCB 201 may be on different surfaces. In a non-limiting example, the third connection portions 231 of the first PCB 201 may be on only one side (e.g., the left side in FIG. 1) of the first PCB 201 in the first direction X. In one embodiment, the first connection portions 211 and the third connection portion 231 of the first PCB 201 may respectively be on respective sides of the first PCB 201 relative to a virtual reference line extending in the second direction Y.

The second PCB 900 may include fourth connection portions 940 on its front surface (e.g., an upper surface in FIG. 4), e.g., a surface of the second PCB 900 facing the first PCB 201.

The third connection portions 231 may be electrically connected to the fourth connection portions 940. For example, the first PCB 201 and the second PCB 900 may be connected to each other by the third connection portions 231 and the fourth connection portions 940, and exchange signals with each other through the third connection portions 231 and the fourth connection portions 940.

Each of the third and fourth connection portions 231 and 940 may be a conductive pad having a large area. For example, the third connection portions 231 and the fourth connection portions 940 may be a plurality of rod-shaped pads extending in the second direction Y. In FIG. 10, the third connection portions 231 and the fourth connection portions 940 are in contact with each other and are directly electrically connected to each other. In one embodiment, the third connection portions 231 and the fourth connection portions 940 may also be indirectly electrically connected to each other, for example, by an anisotropic conductive film, an anisotropic conductive adhesive, or an anisotropic conductive paste. In one embodiment, the third connection portions 231 and the fourth connection portions 940 may be electrically connected to each other, for example, by forming a plug-socket structure.

The second touch sensing unit 800 and the second PCB 900 may be electrically connected by the second circuit film 950. For example, the second circuit film 950 may provide a path through which signals are transmitted between the second touch sensing unit 800 and the second PCB 900.

The second circuit film 950 may include an insulating base and conductive circuit patterns printed on the surface of the insulating base. The insulating base of the second circuit film 950 may be made of a material having greater flexibility than the insulating base of the second PCB 900. Like the first circuit film 250, the second circuit film 950 may be bent in the second direction Y. The bent second circuit film 950 may have a concave surface and a convex surface. The bent second circuit film 950 may partially overlap the display panel 100 and the first PCB 201 in the third direction Z.

One or more driving chips may be on the second PCB 900 and/or the second circuit film 950. In FIG. 10, the second touch sensing unit 800 and the first PCB 201 are connected by a relatively rigid PCB (e.g., the second PCB 900) and a relatively flexible circuit film (e.g., the second circuit film 950). In one embodiment, the second circuit film 950 may be omitted, and the second PCB 900 may have flexibility and may be bent in the second direction Y. Therefore, the second touch sensing unit 900 and the first PCB 201 may be electrically connected to each other by the conductive circuit patterns on the surface of the second PCB 900.

Figure 11:
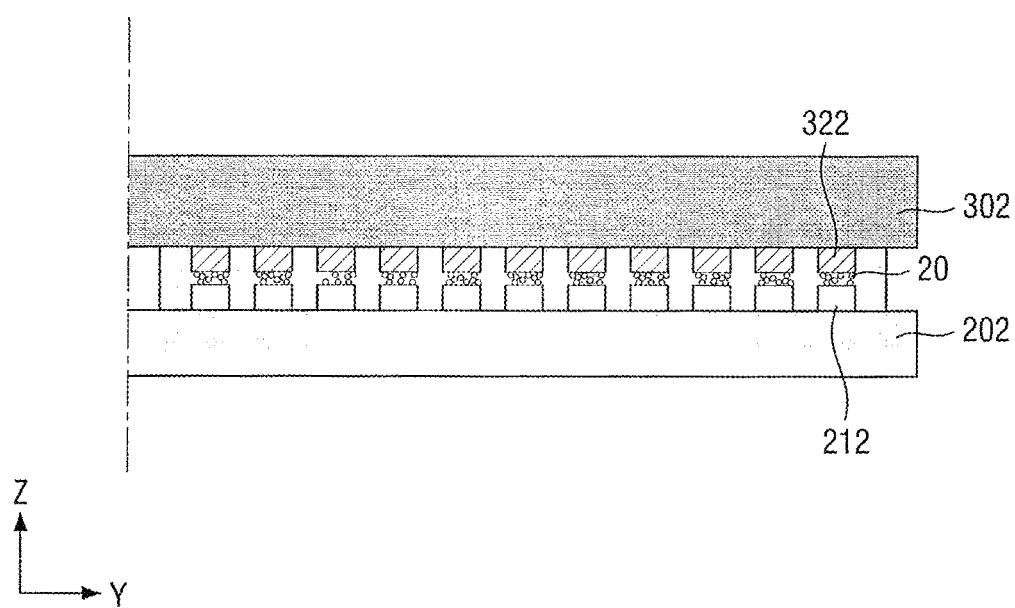
FIG. 11 illustrates another embodiment of a connection between a PCB and a touch sensing unit.

FIG. 11 illustrates an embodiment of a connection between a first PCB 202 and a first touch sensing unit 302 of a display device. Referring to FIG. 11, this display device is different from the display device of FIG. 1 in that first connection portions 212 of the first PCB 202 and second connection portions 322 of the first touch sensing unit 302 are indirectly electrically connected to each other.

In an embodiment, the first PCB 202 may include the first connection portions 212 on its front surface (e.g., an upper surface in FIG. 11), and the first touch sensing unit 302 may include the second connection portions 322 on its back surface (e.g., a lower surface in FIG. 11). The first connection portions 212 and the second connection portions 322 may be rod-shaped pads extending in a direction.

The first connection portions 212 and the second connection portions 322 may overlap each other in the third direction Z. The first connection portions 212 and the second connection portions 322 may be spaced apart from each other in the third direction Z and electrically connected to each other in the third direction Z. For example, the first connection portions 212 and the second connection portions 322 may be electrically connected by an anisotropic conductive film, an anisotropic conductive adhesive, or an anisotropic conductive paste. A plurality of conductive balls 20 may be between the first and second connection portions 212 and 322. The conductive balls 20 may at least partially contact the first connection portions 212 and the second connection portions 322 to electrically connect the first connection portions 212 and the second connection portions 322.

Figure 12:
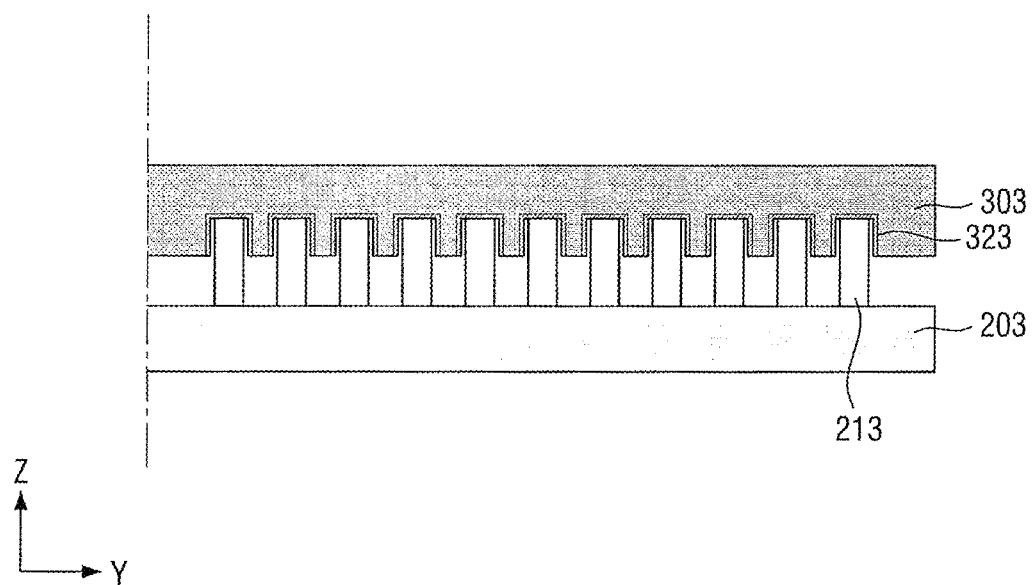
FIG. 12 illustrates another embodiment of a connection between a PCB and a touch sensing unit.

FIG. 12 illustrates an embodiment of a connection between a first PCB 203 and a first touch sensing unit 303 of a display device. Referring to FIG. 12, this display device is different from the display device of FIG. 1 in that first connection portions 213 of the first PCB 203 and second connection portions 323 of the first touch sensing unit 303 are in a plug-socket structure.

In an embodiment, the first PCB 203 may include the first connection portions 213 on its front surface (e.g., an upper surface in FIG. 12), and the first touch sensing unit 303 may include the second connection portions 323 on its back surface (e.g., a lower surface in FIG. 12). The first connection portions 213 and the second connection portions 323 may overlap each other in the third direction Z and may directly contact each other and be directly electrically connected to each other.

The first connection portions 213 and the second connection portions 323 may be directly electrically connected to each other, for example, in a plug-socket structure. The first connection portions 213 may include plugs protruding from the upper surface of the first PCB 203. In addition, the second connection portions 323 may be recessed in the form of sockets into which the first connection portions 213 are be inserted. The first connection portions 213 and the second connection portions 323 may be, for example, substantially circular or polygonal in plan view and may be spaced apart from each other along the first direction X and/or the second direction Y.

In FIG. 12, the first connection portions 213 of the first PCB 203 are plug-shaped and the second connection portions 323 of the first touch sensing unit 303 are socket-shaped. In one embodiment, the first connection portions 213 of the first PCB 203 may be socket-shaped and the second connection portions 323 of the first touch sensing unit 303 may be plug-shaped.

In accordance with one or more of the aforementioned embodiments, one or more touch sensing units of a display device are between a display panel and a PCB. Therefore, the structure of the display device may be simplified and the durability of the display device may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
   a display panel;
   a first printed circuit board (PCB), on the display panel, to provide a signal to drive the display panel; and
   a first touch sensor between the display panel and the first PCB, wherein
   the first PCB includes a first connection portion on a surface of the first PCB facing the first touch sensor,
   the first touch sensor includes a second connection portion on a surface of the first touch sensor facing the first PCB that electrically connects to the first connection portion,
   the display panel has a first surface and a second surface,
   the display panel is to display an image on the first surface,
   the first PCB is on the second surface of the display panel, and
   the display device further comprises:
      a second touch sensor on the first surface of the display panel; and
      a second PCB electrically connected to the second touch sensor and the first PCB, wherein
      the second PCB and the first touch sensor are spaced apart from each other, and
      the first PCB is between the second PCB and the first touch sensor.

2. The display device as claimed in claim 1, wherein the first touch sensor is to sense a magnitude of pressure applied through a touch operation.

3. The display device as claimed in claim 1, further comprising:
   a front cover on the first surface of the display panel, wherein
   the front cover has a flat portion and a bent portion, and
   the second connection portion does not overlap the bent portion.

4. The display device as claimed in claim 1, wherein:
   the first PCB further includes a third connection portion on a surface of the first PCB facing the second PCB, and
   the second PCB includes a fourth connection portion on a surface of the second PCB facing the first PCB and electrically connected to the third connection portion.

5. The display device as claimed in claim 1, further comprising:

a composite sheet between the display panel and the first touch sensor, wherein
the composite sheet includes one or more of a buffer sheet, a strength reinforcing sheet, a heat dissipating sheet, an electromagnetic wave shielding sheet, and a light shielding sheet.

6. The display device as claimed in claim 1, further comprising:
a front cover on the display panel and having a flat portion and a bent portion at edges of the flat portion in a first direction; and
a flexible circuit film electrically connected to the display panel and the first PCB, wherein
the bent portion of the front cover includes a surface curved in the first direction, and
the flexible circuit film is bent in a second direction intersecting the first direction.

7. The display device as claimed in claim 6, wherein:
the first PCB has a first surface opposing a second surface,
the first PCB includes a third connection portion on the second surface,
the first connection portion is on a first side of the first PCB in the first direction, and
the third connection portion is on a second side of the first PCB in the first direction.

8. The display device as claimed in claim 6, wherein:
the first PCB has a first surface opposing a second surface, and
the display device includes:
a first driving chip on the second surface of the first PCB and overlapping the first touch sensor; and
a second driving chip on a concave surface of the flexible circuit film and not overlapping the first touch sensor.

9. The display device as claimed in claim 6, wherein:
the display panel is connected to the flexible circuit film by a concave surface of the flexible circuit film, and
the first PCB is connected to the flexible circuit film by the concave surface of the flexible circuit film.

10. The display device as claimed in claim 6, wherein:
the first touch sensor is longer in the first direction than in the second direction,
a length of the front cover in the second direction is greater than a length of the display panel in the second direction,
an end of the display panel in the second direction protrudes more than an end of the first touch sensor in the second direction, and
a length of the first PCB in the second direction is greater than the length of the first touch sensor in the second direction.

11. The display device as claimed in claim 1, wherein the first connection portion contacts the second connection portion.

12. The display device as claimed in claim 1, further comprising:
conductive balls between the first connection portion and the second connection portion, wherein the first connection portion and the second connection portion are electrically connected by the conductive balls.

13. The display device as claimed in claim 1, wherein the first connection portion is electrically connected to the second connection portion using a plug-socket structure.

14. A display device, comprising:
a display panel;
a first printed circuit board (PCB), on the display panel, to provide a signal to drive the display panel;
a first touch sensor between the display panel and the first PCB, wherein the first PCB includes a first connection portion on a surface of the first PCB facing the first touch sensor and wherein the first touch sensor includes a second connection portion on a surface of the first touch sensor facing the first PCB that electrically connects to the first connection portion; a front cover on the display panel and having a flat portion and a bent portion at edges of the flat portion in a first direction; and
a flexible circuit film electrically connected to the display panel and the first PCB, wherein the bent portion of the front cover includes a surface curved in the first direction and wherein the flexible circuit film is bent in a second direction intersecting the first direction, wherein the display device further comprises:
a second touch sensor between the display panel and the front cover; and
a second PCB electrically connected to the second touch sensor and the first PCB, wherein a length of the second PCB in the second direction is greater than the length of the first touch sensor in the second direction.

15. The display device as claimed in claim 14, wherein the second PCB and the first touch sensor partially overlap each other.

* * * * *